United States Patent
Wahlberg

(10) Patent No.: US 6,512,418 B1
(45) Date of Patent: Jan. 28, 2003

(54) AMPLIFIER

(76) Inventor: Andreas Wahlberg, Mellanvägen 5, Uppsala (SE), 756 45

( * ) Notice: Subject to any disclaimer, the term of this patent is extended or adjusted under 35 U.S.C. 154(b) by 0 days.

(21) Appl. No.: 09/830,581

(22) PCT Filed: Nov. 11, 1999

(86) PCT No.: PCT/SE99/02050

§ 371 (c)(1),
(2), (4) Date: May 10, 2001

(87) PCT Pub. No.: WO00/35079

PCT Pub. Date: Jun. 15, 2000

(30) Foreign Application Priority Data

Nov. 20, 1998 (SE) ................................................ 9803980

(51) Int. Cl.[7] .............................. H03F 3/04; H03G 3/12
(52) U.S. Cl. ........................ 330/310; 330/283; 330/296
(58) Field of Search ................................. 330/310, 283, 330/296

(56) References Cited

U.S. PATENT DOCUMENTS

| | | | | |
|---|---|---|---|---|
| 3,633,121 A | * | 1/1972 | Bretl | 330/145 |
| 4,274,059 A | * | 6/1981 | Okabe | 330/266 |
| 4,384,261 A | * | 5/1983 | Yokoyama | 330/265 |
| 5,146,181 A | | 9/1992 | Bowers et al. | 330/268 |
| 5,198,782 A | * | 3/1993 | Scott | 330/277 |
| 5,710,522 A | | 1/1998 | Pass | 330/291 |

* cited by examiner

*Primary Examiner*—Patricia Nguyen
(74) *Attorney, Agent, or Firm*—Jacobson Holman PLLC

(57) ABSTRACT

An amplifier including a first transistor whose emmiter is connected to an amplifier output and whose collector is connected to a first of two current supply terminals, with the base of the first transistor being connected to an input. A constant load circuit is connected between the emitter of the first transistor and the second current supply terminal. The constant load circuit is adapted to ensure that the current through the first transistor will always exceed a lowest value, so that the first transistor will always lie in a limited, generally linear area of its working curve.

20 Claims, 1 Drawing Sheet

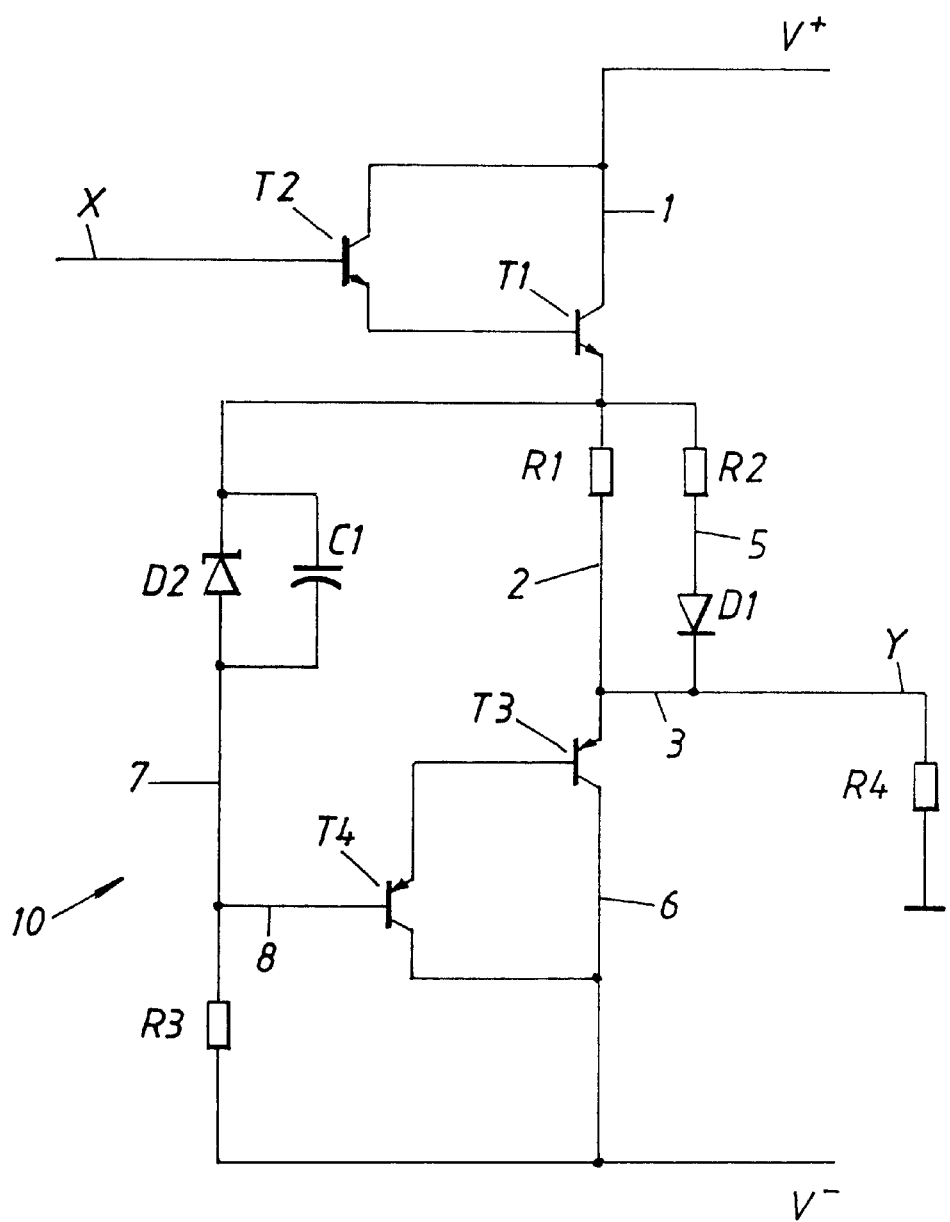

AMPLIFIER

BACKGROUND OF THE INVENTION

1. Field of the Invention

The present invention relates to an amplifier including a first transistor whose emitter is connected to an amplifier output and whose collector is connected to a first of two current supply terminals, with a base of the first transistor being connected to an input.

A primary object of the invention is to provide an amplifier, particularly an audiofrequency amplifier which will reproduce true-to-life sound (speech, music, etc.).

2. Description of the Related Art

Audiofrequency amplifiers are well known in semiconductor constructions, where great efforts have been made to provide lifelike sound reproduction. In practice, however, developments have not proceeded to any great extent, since tube amplifiers are still considered to provide splendid sound in comparison with semiconductor constructions.

SUMMARY OF THE INVENTION

Accordingly, an object of the present invention is to provide a semiconductor amplifier which while affording the advantages associated with a class-A amplifier will not have the dominant drawback of the class-A amplifier, namely poor efficiency.

For instance, true-to-life sound reproduction can be achieved with a tube-equipped class-A amplifier that includes a constant current generator (or a resistor), by virtue of the fact that current amplification can be achieved in a small delimited area of the working curve of the current amplifying unit. This results in good linearity while eliminating any overtone distortions.

The inventive amplifier stage includes a first transistor whose emitter is connected to an amplifier output and whose collector is connected to a first of two current supply terminals, the base of the first transistor being connected to a signal input.

The invention is directed to an amplifier including a first transistor whose emitter is connected to an amplifier output and whose collector is connected to a first of two current supply terminals, with a base of the first transistor being connected to an input. Thus, in order to achieve very pure sound of high transparency with such an amplifier at the same time as the efficiency of the amplifier is much greater than the efficiency of a class-A amplifier, the inventive amplifier is designed so as to include a sensing circuit (constant load circuit) between the emitter of the first transistor and the second current supply terminal, and the sensing circuit is adapted to ensure that the current through the first transistor will always exceed a lowest value, so that the transistor will constantly lie in a delimited, generally linear area of its working curve.

In one embodiment of the invention, the emitter of the first transistor may be connected to the amplifier output via a first conductor part which includes a first resistance, wherewith a second conductor part is connected to the first conductor part in parallel and contains a second resistance and a diode in series therewith.

The constant load circuit includes a second transistor whose collector is connected to the second current supply terminal and whose emitter is connected to the load. The constant load circuit also includes a shunt line between the second current supply terminal and the emitter of the first transistor, wherewith the shunt line of the constant load circuit includes an adjustable zener diode or a corresponding device which is set so that the diode of the second conductor part will not conduct when the amplifier idles. The input of the second transistor is connected to the shunt line between the second current supply terminal and the adjustable diode. A third transistor may be connected in the Darlington-arrangement with the second transistor in the constant load circuit. The constant load circuit is adapted to ensure that current will continue to flow through the first resistance (resistor) of the first conductor part. A fourth transistor is suitably connected in a Darlington-arrangement with the first transistor, between said input and the first transistor. The constant load circuit is adapted to ensure that the first and the fourth transistor will continue to conduct even on the negative half of the output signal.

BRIEF DESCRIPTION OF THE DRAWINGS

The invention will now be described in more detail by way of example with reference to the accompanying drawing.

FIG. 1 is a schematic illustration of an inventive amplifier.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Shown in FIG. 1 are two current supply terminals, namely +supply and −supply, $V^+$ and $V^-$ respectively. Also shown is an input line X to which an input signal is delivered. The illustration also includes an output line Y which delivers an output signal via a load indicated by resistance R4. Two transistors T1, T2 are connected in a Darlington-arrangement in a conductor path 1, 2, 3 between the +supply $V^+$ and the output Y.

The conductor path includes three mutually sequential conductor sections 1, 2 and 3, wherewith the transistors T1, T2 are connected on the conductor section 1 (the transistor T2 being controlled by the input X and controlling the transistor T1). The conductor section 2 includes a resistance R1. A conductor section 5, which is parallel with the conductor section 2, includes a resistance R2 in series with a diode D1. R2, D1 are adapted to ensure that the voltage drop across R1 will not be excessively large in the event of a positive swing. The conductor section 2 is connected to the −supply $V^-$ by a conductor section 6. A shunt line 7 is arranged parallel with the conductor sections 2 and 6. As seen in a direction away from the −supply $V^-$, the conductor section 7 includes a resistance R3 and then an adjustable diode D2 that includes a parallel-connected capacitance C1. Two transistors T3, T4 are connected in a Darlington-arrangement in the conductor section 6, wherewith the transistor T4 is controlled via an input line 8 from the conductor section 7 between the diode D2 and the resistance R3. D2 is selected so that D1 will not conduct when the amplifier idles. When the signal on the input X is below 0 volts, the constant load circuit 10 (D2, T4, T3) ensures that current continues to flow through R1. Thus, T1, T2 will continue to conduct even on the negative half period of the output.

The constant load 10 ensures that the transistor T1 can handle the second polarity on the output Y. Thus, as a result of the inventive constant load 10 the occurrent loss in efficiency is limited by ensuring that the current through the transistor T1 will always exceed a lowest value. Due to this current, the transistor T1 will always lie in a small restricted area of its working curve. This results in good linearity with respect to power gain and eliminates or minimizes the transition distortion so as to enable such distortion to be ignored. One advantage afforded by the inventive amplifier is that the components required are far fewer than those required in a conventional amplifier stage. Another advantage is that the inventive amplifier will nevertheless produce absolutely pure sound with a very high degree of transparency. The illustrated circuit includes bipolar transistors, although the person skilled in this art will realize that other types of semiconductors can be used.

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

I claim:

1. An amplifier comprising a first transistor having a base connected to an input, an emitter connected to an amplifier output via a conductor path which includes a first resistance, and a collector connected to a first of two current supply terminals; and a constant load circuit connected between the emitter of the first transistor and the second current supply terminal, said constant load circuit adapted to ensure that the current through the first transistor exceeds a lowest value, so that the first transistor remains in a limited, generally linear area of its working curve, and a conductor part being connected in parallel to the first resistance and having in series a second resistance and a first diode which conducts current in a direction towards the output.

2. The amplifier according to claim 1, wherein the constant load circuit includes a second transistor having a collector connected to the second current supply terminal and an emitter connected to said output, said constant load circuit also including a shunt line between the second current supply terminal and the emitter of the first transistor which includes an adjustable diode set so that the first diode of the conductor part will not conduct when the amplifier idles, an input of the second transistor being connected to the shunt line between the second current supply terminal and the adjustable diode.

3. The amplifier according to claim 2, wherein the shunt line includes a third resistance between the second current supply terminal and the adjustable diode, the input of the second transistor being connected to the shunt line between the third resistance and the adjustable diode.

4. The amplifier according to claim 2, further comprising a third transistor connected in Darlington-arrangement with the second transistor in the load circuit.

5. The amplifier according to claim 2, wherein the load circuit is adapted to ensure that current will continue to flow through the first resistance.

6. The amplifier according to claim 1, further comprising a fourth transistor connected in Darlington-arrangement with the first transistor between the input and the first transistor.

7. The amplifier according to claim 6, wherein the constant load circuit is adapted to ensure that the first and the fourth transistors will continue to conduct even on negative period parts of the output.

8. An amplifier comprising:

a first transistor having a base connected to an input, an emitter connected to an amplifier output and a collector connected to a first of two current supply terminals;

a constant load circuit connected between the emitter of the first transistor and the second current supply terminal, said constant load circuit adapted to ensure that the current through the first transistor will always exceed a lowest value, so that the first transistor will always lie in a limited, generally linear area of its working curve; and a further transistor connected in Darlington-arrangement with the first transistor between the input and the first transistor.

9. The amplifier according to claim 8, wherein the constant load circuit is adapted to ensure that said first and said further transistors will continue to conduct even on negative period parts of the output.

10. The amplifier according to claim 8, wherein the emitter of the first transistor is connected to the amplifier output via a conductor path which includes a first resistance, a conductor part being connected in parallel to the first resistance and including in series a second resistance and a first diode which conduct current in a direction towards the output.

11. The amplifier according to claim 10, wherein the constant load circuit includes a still further transistor whose collector is connected to the second current supply terminal and whose emitter is connected to said output, said constant load circuit including a shunt line between the second current supply terminal and the emitter of the first transistor which is set so that the diode of the conductor part will not conduct when the amplifier idles, an input of said still further transistor being connected to the shunt line between the second current supply terminal and the adjustable diode.

12. The amplifier according to claim 11, wherein the shunt line includes a third resistance between the second current supply terminal and the adjustable diode, the input of the still further transistor being connected to the shunt line between the third resistance and the adjustable diode.

13. The amplifier according to claim 11, wherein a yet further transistor is connected in Darlington-arrangement with the still further transistor in the load circuit.

14. The amplifier according to claim 11, wherein the load circuit is adapted to ensure that current will continue to flow through the first resistance.

15. An amplifier comprising:

a first transistor having a base connected to an input, an emitter connected to an amplifier output and a collector connected to a first of two current supply terminals; and a constant load circuit connected between the emitter of the first transistor and the second current supply terminal, said constant load circuit adapted to maintain said first transistor in a generally linear area of its working curve and above a minimum value, said constant load circuit including a second transistor having a collector connected to the second current supply terminal, an emitter connected to said output, and a shunt line between the second current supply terminal and the emitter of the first transistor.

16. The amplifier according to claim 15, wherein the emitter of the first transistor is connected to the amplifier output via a conductor path which includes a first resistance, a conductor part being connected in parallel to the first resistance and having in series a second resistance and a first diode which conduct current in a direction towards the output.

17. The amplifier according to claim 15, wherein said shunt line includes an adjustable diode, an input of the second transistor being connected to the shunt line between the second current supply terminal and the adjustable diode.

18. The amplifier according to claim 17, wherein the shunt line includes a third resistance between the second current supply terminal and the adjustable diode, the input of the second transistor being connected to the shunt line between the third resistance and the adjustable diode.

19. The amplifier according to claim 17, further comprising a third transistor connected in Darlington-arrangement with the second transistor in the load circuit.

20. The amplifier according to claim 15, wherein a third transistor is connected in Darlington-arrangement with the second transistor in the load circuit.

* * * * *